United States Patent
Lin et al.

(10) Patent No.: US 9,455,666 B2
(45) Date of Patent: Sep. 27, 2016

(54) MULTIPLE FREQUENCY LC VOLTAGE CONTROLLED OSCILLATOR SCHEME

(71) Applicant: Taiwan Semiconductor Manufacturing Company, Ltd., Hsin-Chu (TW)

(72) Inventors: Chih-Chang Lin, San Jose, CA (US); Chan-Hong Chern, Palo Alto, CA (US); Ming-Chieh Huang, San Jose, CA (US); Tien-Chun Yang, San Jose, CA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/622,626

(22) Filed: Feb. 13, 2015

(65) Prior Publication Data

US 2016/0241187 A1    Aug. 18, 2016

(51) Int. Cl.
*H03B 5/08* (2006.01)
*H03B 5/12* (2006.01)
*H03B 1/00* (2006.01)
*H03L 7/095* (2006.01)

(52) U.S. Cl.
CPC .............. *H03B 5/1262* (2013.01); *H03B 1/00* (2013.01); *H03B 5/1228* (2013.01); *H03L 7/095* (2013.01)

(58) Field of Classification Search
CPC .... H03B 1/00; H03B 5/1228; H03B 5/1262; H03B 5/08; H03L 7/095
USPC ...... 331/167, 2, 46, 49, 179, 117 R, 117 FE, 331/177 V
See application file for complete search history.

(56) References Cited

U.S. PATENT DOCUMENTS

| | | | |
|---|---|---|---|
| 5,686,864 A * | 11/1997 | Martin | H03L 7/095 327/107 |
| 7,333,779 B2 * | 2/2008 | Yamawaki | H03D 13/007 331/2 |
| 8,368,479 B2 * | 2/2013 | Grewing | H03L 7/0995 331/16 |
| 8,432,229 B2 * | 4/2013 | Dong | H03B 5/1228 331/167 |

* cited by examiner

*Primary Examiner* — Arnold Kinkead
(74) *Attorney, Agent, or Firm* — Slater Matsil, LLP

(57) ABSTRACT

A circuit includes at least two LC voltage controlled oscillators (LCVCOs). Each LCVCO includes a switch to selectively turn on or off the LCVCO. One selected LCVCO of the at least two LCVCOs is configured to provide a differential LCVCO output. A converter coupled to the at least two LCVCOs is configured to receive the differential LCVCO output and provide an output signal with a full voltage swing.

20 Claims, 5 Drawing Sheets

MULTIPLE FREQUENCY LC VOLTAGE CONTROLLED OSCILLATOR SCHEME

BACKGROUND

An Inductor-Capacitor voltage controlled oscillator (LCVCO) is a linear or harmonic oscillator that generates a sinusoidal waveform. The LCVCO includes a resonator with an inductor L and a capacitor C. In some applications, the LCVCO includes a varactor that can be used to change the capacitance and hence the frequency of an LC tank. The varactor's capacitance is controlled by the voltage across the varactor device to control the resonant frequency in some applications. However, the LCVCOs using varactors to control the operating frequency have a relatively limited frequency tuning range, smaller than 15% of the oscillation frequency in some LCVCOs.

In some applications, multiple LCVCOs with different operating frequencies are multiplexed to cover a relatively wider range of frequency operations. Such multiplexed LCVCOs have performance and design shortcomings as power supply voltages decrease and the operating speeds increase. For example, some LCVCO multiplexer circuits face voltage headroom (margin) issue with a decreased power supply voltage and/or operating speed limit due to the circuit structure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
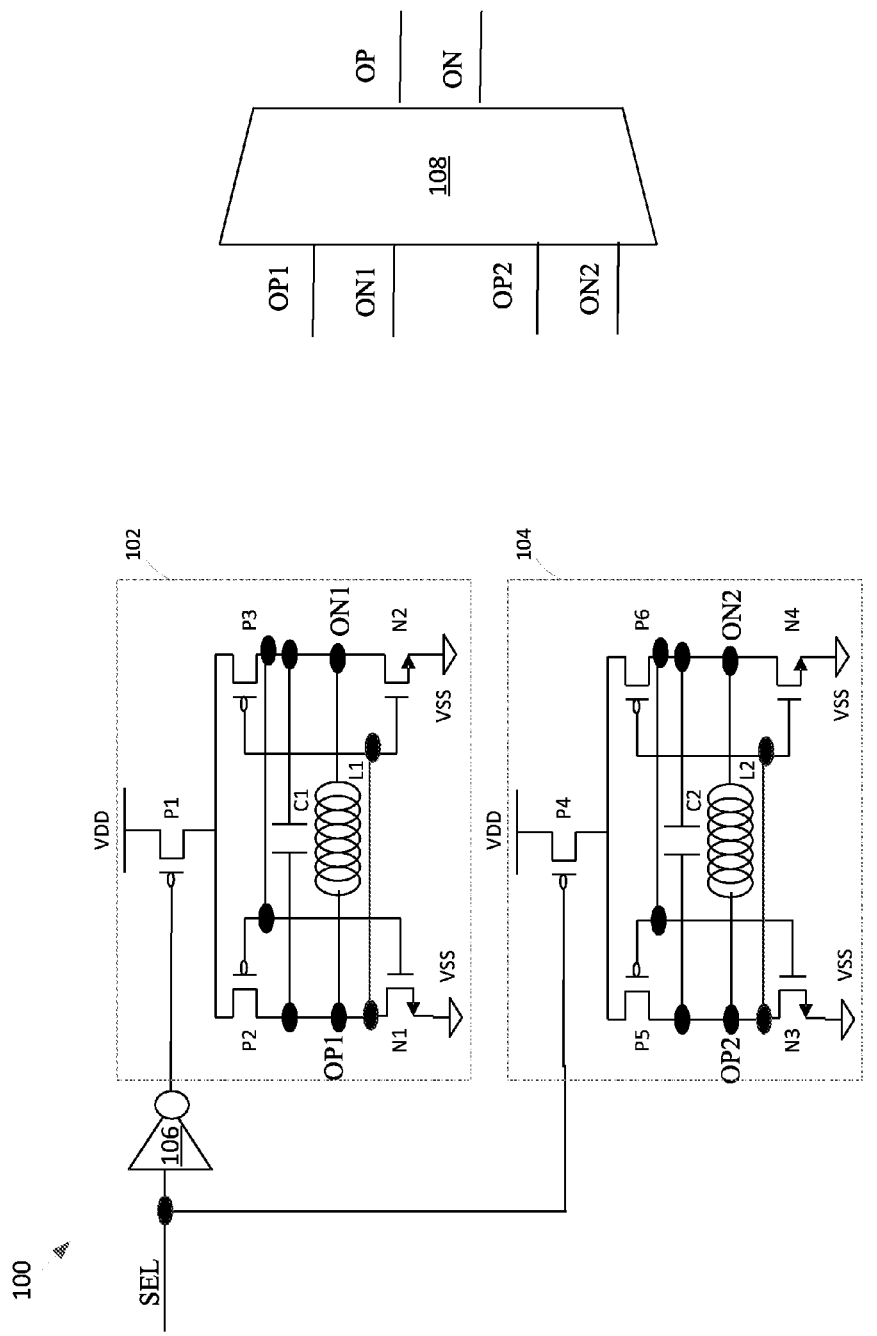
FIG. 1 is an exemplary multiple frequency LCVCO in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

For low phase noise performance, an Inductor-Capacitor Voltage Controlled Oscillator (LCVCO) is used in some applications. For example, an LCVCO may be part of a phase-locked loop (PLL). PLLs are used in electronic designs such as radios, television receivers, video apparatuses, satellite broadcasts and instrumentation systems. In some applications, multiple LCVCOs having different operating frequencies are multiplexed to cover a wide range of frequency operations.

FIG. 1 is an exemplary multiple frequency LCVCO 100 in accordance with some embodiments. The multiple frequency LCVCO 100 includes two LCVCO 102 and 104, and a multiplexer 108. The LCVCOs 102 and 104 have different operating frequencies in some embodiments. Each LCVCO 102 or 104 includes an inductor, a capacitor, and two cross coupled pairs of serially connected PMOS transistor and NMOS transistor. Also, each LCVCO 102 or 104 includes a switch to turn on or off the LCVCO 102 or 104.

For example, the LCVCO 102 includes a PMOS transistor P2 serially connected with an NMOS transistor N1. Another PMOS transistor P3 is serially connected with an NMOS transistor N2. The gates of the serially connected PMOS transistor P2 and NMOS transistor N1 are connected to the drains of the serially connected PMOS transistor P3 and NMOS transistor N2. The gates of the serially connected PMOS transistor P3 and NMOS transistor N2 are connected to the drains of the serially connected PMOS transistor P2 and NMOS transistor N1. An inductor L1 and a capacitor C1 are connected to the drains of the PMOS transistors P2 and P3, and NMOS transistors N1 and N2. The sources of the PMOS transistors P2 and P3 are connected to the power supply voltage VDD through a PMOS transistor P1 functioning as a switch to turn on or off the LCVCO 102. The sources of the NMOS transistors N1 and N2 are connected to a ground voltage VSS. The operating frequency f1 is given by the equation $$f1 = \frac{1}{2\pi\sqrt{L1 \cdot C1}},$$

based on the resonance condition of the inductor L1 and the capacitor C1. The differential output of the LCVCO 102 is provided by two outputs OP1 and ON1.

Similarly, the LCVCO 104 includes a PMOS transistor P5 serially connected with an NMOS transistor N3. Another PMOS transistor P6 is serially connected with an NMOS transistor N4. The gates of the serially connected PMOS transistor P5 and NMOS transistor N3 are connected to the drains of the serially connected PMOS transistor P6 and NMOS transistor N4. The gates of the serially connected PMOS transistor P6 and NMOS transistor N4 are connected to the drains of the serially connected PMOS transistor P5 and NMOS transistor N3. An inductor L2 and a capacitor C2 are connected to the drains of the PMOS transistors P5 and P6, and NMOS transistors N3 and N4. The sources of the PMOS transistors P5 and P6 are connected to the power supply voltage VDD through a PMOS transistor P4 functioning as a switch to turn on or off the LCVCO 104. The sources of the NMOS transistors N3 and N4 are connected to a ground voltage VSS. The operating frequency f2 is given by the equation $$f2 = \frac{1}{2\pi\sqrt{L2 \cdot C2}},$$

based on the resonance condition of the inductor L2 and the capacitor C2. The differential output of the LCVCO 104 is provided by two outputs OP2 and ON2.

The PMOS transistor switches P1 and P4 are controlled by a control signal SEL. The control signal SEL is connected to the PMOS transistor P1 through an inverter 106 and connected to the PMOS transistor P4 without an inverter. The control signal SEL can selectively turn on one LCVCO of the two LCVCOs 102 and 104. In some embodiments, one LCVCO is selected based on the operating frequency of the LCVCO. For example, if the control signal SEL=1 (logic high), the control signal is inverted by the inverter 106 to logic low and connected to the gate of the PMOS transistor P1, thus turning on the PMOS transistor P1. By turning on the PMOS transistor P1, the LCVCO 102 is turned on. The control signal SEL=1 is connected to the gate of the PMOS transistor P4, thus turning off the PMOS transistor P4. By turning off the PMOS transistor P4, the LCVCO 104 is turned off.

The differential outputs from the LCVCO 102 (OP1 and ON1) and the LCVCO 104 (OP2 and ON2) are connected to the multiplexer 108, which in turn provides a differential output (OP and ON). In the example above (with the control signal SEL=1), the multiplexer output OP and ON is provided by the LCVCO 102 (OP1 and ON1) since LCVCO 102 is turned on and LCVCO 104 is turned off by the control signal SEL. If the control signal SEL=0, the multiplexer outputs OP and ON are provided by the LCVCO 104 (OP2 and ON2) since LCVCO 102 is turned off and LCVCO 104 is turned on by the control signal SEL. Even though two LCVCOs 102 and 104 are connected to the multiplexer 108 in FIG. 1, a greater number of LCVCOs can be connected to the multiplexer 108 with the control signal connected to each LCVCO arranged to turn on one LCVCO and turn off the rest of LCVCOs. For example, three, four, five, etc. LCVCOs can be connected to the multiplexer 108. An exemplary multiplexer circuit 108 is described below.

Figure 2:
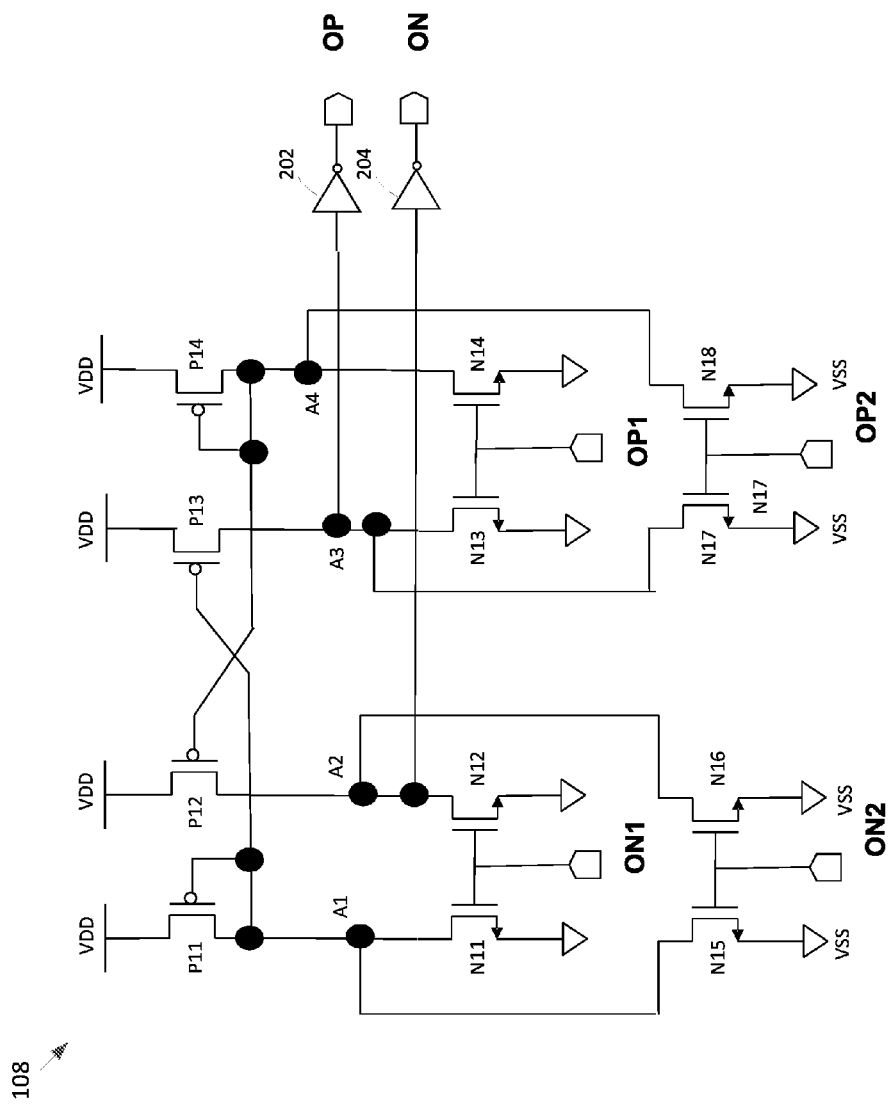
FIG. 2 is an exemplary multiplexer for the multiple frequency LCVCO in FIG. 1 in accordance with some embodiments.

FIG. 2 is an exemplary multiplexer 108 for the multiple frequency LCVCO in FIG. 1 in accordance with some embodiments. The multiplexer 108 is a converter connected to the LCVCO outputs ON1, OP1, ON2, OP2 and provides a differential output signal (OP and ON) with a full voltage swing from VDD to ground in some embodiments. In the description below, the multiplexer 108 is also referred to as the converter 108. Due to parasitic resistance in the LCVCOs 102 and 104, the outputs OP1, ON1, OP2, ON2 may not have a full voltage swing. For example, when the power supply voltage VDD=0.8 V, the voltage swing of OP1, ON1, OP2, ON2 may be from 0.2 V to 0.6 V, instead of from 0 V to 0.8 V in some embodiments. The converter 108 receives the LCVCO differential outputs OP1, ON1, OP2, ON2 with a less than full voltage swing, such as from 0.2 V to 0.6 V, and provides a differential output OP and ON with a full voltage swing from 0 V to 0.8 V.

The converter 108 includes four PMOS transistors P11, P12, P13, and P14 connected to the power supply voltage VDD. The PMOS transistors P11 and P14 are diode-connected and gates of PMOS transistors P12 and P13 are connected to the drains of PMOS transistors P14 and P11, respectively.

Four NMOS transistors N11, N12, N13, and N14 are serially connected to the four PMOS transistors P11, P12, P13, and P14, respectively. The differential output ON1 and OP1 from LCVCO 102 is connected to the gates of NMOS transistors N11, N12, and N13, N14, respectively of the converter 108. The gates of the NMOS transistors N11 and N12 are connected to one signal ON1 of the differential output from LCVCO 102. The gates of the NMOS transistors N13 and N14 are connected to the other signal OP1 of the differential output from LCVCO 102.

The differential output ON2 and OP2 from LCVCO 104 is connected to the converter 108 through NMOS transistors N15, N16, N17, and N18. The NMOS transistors N15, N16, N17, and N18 are also serially connected to the PMOS transistors P11, P12, P13, and P14, respectively. The gates of the NMOS transistors N15 and N16 are connected to one signal ON2 of the differential output from LCVCO 104. The gates of the NMOS transistors N17 and N18 are connected to the other signal OP2 of the differential output from LCVCO 104.

The drains of the PMOS transistor P12, NMOS transistor N12 and N16 are connected to an inverter 204 that provides one signal ON of the differential output from the converter 108. The drains of the PMOS transistor P13, NMOS transistor N13 and N17 are connected to an inverter 202 that provides the other signal OP of the differential output from the converter 108.

As an example, the LCVCO 102 is selected to be turned on and the differential output from LCVCO 102 has a first signal OP1 having logic 1 (logic high), and a second signal ON1 having logic 0 (logic low). Since OP1 has logic 1, NMOS transistors N13 and N14 are turned on. Thus, the voltage at a node A3 is pulled down to logic 0 (by N13). Node A3 is connected to the inverter 202 that provides logic 1 (the same as OP1) as the other signal OP of the differential output from the converter 108. Also, node A4 connected to the gate of the PMOS transistor P12 is pulled down to logic 0 (by N14). Thus, the PMOS transistor P12 is turned on. Since ON1 has logic 0, NMOS transistors N11 and N12 are turned off. Since PMOS transistor P12 is turned on and NMOS transistor N12 is turned off, the voltage at node A2 is pulled up to logic 1. Node A2 is connected to the inverter 204 that provides logic 0 as one signal ON (the same as ON1) of the differential output from the converter 108. Therefore, the differential output signal of the converter 108 with OP and ON follows the differential output signal of the LCVCO 102 with OP1 and ON1.

Also, the differential output signal of the converter 108 with OP and ON have a full swing voltage after inverters 202 and 204, i.e., from the power supply voltage VDD to ground, because the inverters 202 and 204 provides voltage output range from VDD to ground. Since LCVCO 104 is not selected in this example, the LCVCO 104 is turned off, and the differential output of the LCVCO 104 with ON2 and OP2 has no signal and does not affect the output OP and ON of the converter 108. If the LCVCO 104 is selected instead of LCVCO 102, the differential output of the converter 108 with OP and ON follows the differential output signal of the LCVCO 104 with OP2 and ON2.

Even though outputs from two LCVCOs 102 and 104 are connected to the multiplexer 108 in FIG. 2, a greater number of LCVCOs can be connected to the multiplexer 108. For example, outputs from three, four, five, etc. LCVCOs can be connected to the multiplexer 108 in a similar way using additional NMOS transistors connected to nodes A1, A2, A3, and A4.

By using the multiple LCVCOs 102 and 104 having PMOS transistor switches P1 and P4, the operation power is saved because one LCVCO is selected to be turned on and the other LCVCO is turned off. The converter 108 as a multiplexer provides a full voltage swing output. In some embodiments, the multiple frequency LCVCO 100 operates with a high speed operating frequency, e.g., LCVCO 102 in 14 GHz and LCVCO104 in 20 GHz. The multiplexer 108 has two layers of serially connected transistors from VDD to ground. One layer of PMOS transistors P11, P12, P13, and P14 connected from the power supply voltage VDD are serially connected to another layer of NMOS transistors N11, N12, N13, N14, N15, N16, N17, and N18 that are connected to the ground. Each layer of serially connected transistors from VDD to ground needs operation voltage at least equal to the transistor threshold voltage. Two layers of serially connected transistors from VDD to ground need less operation voltage than three layers of serially connected transistors from VDD to ground. For a given voltage range from VDD to ground, two layers of transistors have more voltage margin for each layer than three or more layers of transistors. Compared to other multiple frequency LCVCO circuits having a multiplexer with three or more transistor layers connected from the power supply voltage VDD to the ground, there is no voltage headroom (margin) issue related to threshold voltages with the multiplexer 108 in FIG. 2.

Figure 3:
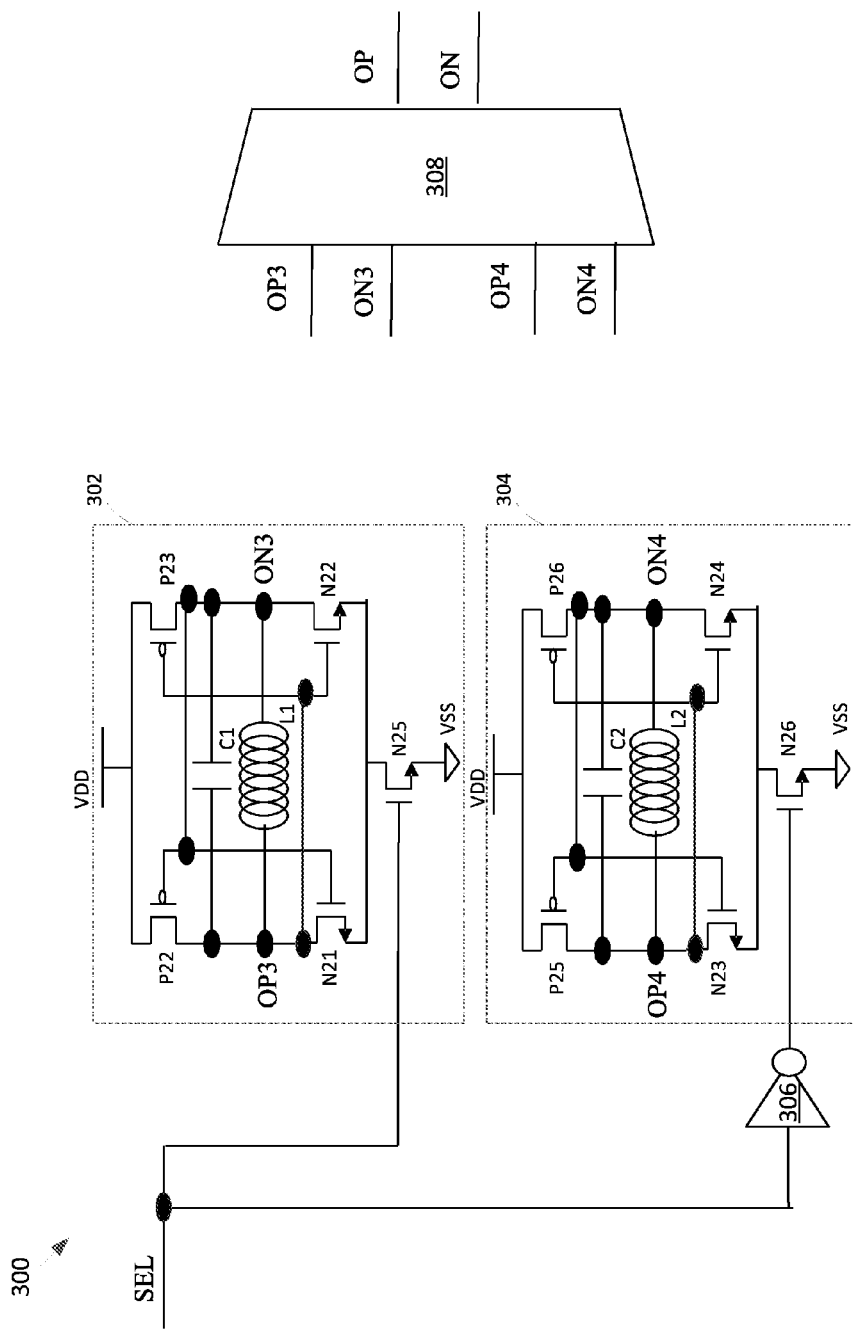
FIG. 3 is another exemplary multiple frequency LCVCO in accordance with some embodiments.

FIG. 3 is another exemplary multiple frequency LCVCO in accordance with some embodiments. The multiple frequency LCVCO 300 includes two LCVCO 302 and 304, and a multiplexer 308. The LCVCOs 302 and 304 have different operating frequencies in some embodiments. Each LCVCO 302 or 304 includes an inductor, a capacitor, and two pairs of a PMOS transistor serially connected to an NMOS transistor that are cross coupled. Also, each LCVCO 302 or 304 includes a switch to turn on or off the LCVCO 302 or 304.

For example, the LCVCO 302 includes a PMOS transistor P22 serially connected with an NMOS transistor N21. Another PMOS transistor P23 is serially connected with another NMOS transistor N22. The gates of the serially connected PMOS transistor P22 and NMOS transistor N21 are connected to the drains of the serially connected PMOS transistor P23 and NMOS transistor N22. The gates of the serially connected PMOS transistor P23 and NMOS transistor N22 are connected to the drains of the serially connected PMOS transistor P22 and NMOS transistor N21. An inductor L1 and a capacitor C1 are connected to the drains of the PMOS transistors P22 and P23, and NMOS transistors N21 and N22. The sources of the PMOS transistors P22 and P23 are connected to the power supply voltage VDD. The sources of the NMOS transistors N21 and N22 are connected to a ground voltage VSS through an NMOS transistor N25 functioning as a switch to turn on or off the LCVCO 302. The operating frequency f1 is given by the equation $$f1 = \frac{1}{2\pi\sqrt{L1 \cdot C1}},$$

based on the resonance condition of the inductor L1 and the capacitor C1. The differential output of the LCVCO 302 is provided by two outputs OP3 and ON3.

Similarly, the LCVCO 304 includes a PMOS transistor P25 serially connected with an NMOS transistor N23. Another PMOS transistor P26 is serially connected with another NMOS transistor N24. The gates of the serially connected PMOS transistor P25 and NMOS transistor N23 are connected to the drains of the serially connected PMOS transistor P26 and NMOS transistor N24. The gates of the serially connected PMOS transistor P26 and NMOS transistor N24 are connected to the drains of the serially connected PMOS transistor P25 and NMOS transistor N23. An inductor L2 and a capacitor C2 are connected to the drains of the PMOS transistors P25 and P26, and NMOS transistors N23 and N24. The sources of the PMOS transistors P25 and P26 are connected to the power supply voltage VDD. The sources of the NMOS transistors N23 and N24 are connected to a ground voltage VSS through an NMOS transistor N26 functioning as a switch to turn on or off the LCVCO 304. The operating frequency f2 is given by the equation $$f2 = \frac{1}{2\pi\sqrt{L2 \cdot C2}},$$

based on the resonance condition of the inductor L2 and the capacitor C2. The differential output of the LCVCO 304 is provided by two outputs OP4 and ON4.

The NMOS transistor switches N25 and N26 are controlled by a control signal SEL. The control signal SEL is connected to the NMOS transistor N26 through an inverter 306 and connected to the NMOS transistor N25 without an inverter. The control signal SEL can selectively turn on one LCVCO of the two LCVCOs 302 and 304. In some embodiments, one LCVCO is selected based on the operating frequency. For example, if the control signal SEL=1 (Logic high) that is connected to the gate of the NMOS transistor N25, the NMOS transistor N25 is turned on. By turning on the NMOS transistor N25, the LCVCO 302 is turned on. The control signal is inverted by the inverter 306 to Logic low and connected to the gate of the NMOS transistor N26, thus turning off the NMOS transistor N26. By turning off the NMOS transistor N26, the LCVCO 304 is turned off.

The differential outputs from the LCVCO 302 (OP3 and ON3) and the LCVCO 304 (OP4 and ON4) are connected to the multiplexer 308, which in turn provides a differential output (OP and ON). In the example above (with the control signal SEL=1), the multiplexer outputs OP and ON are provided by the LCVCO 302 (OP3 and ON3) since LCVCO 302 is turned on and LCVCO 304 is turned off by the control signal SEL. If the control signal SEL=0, the multiplexer outputs OP and ON are provided by the LCVCO 304 (OP4 and ON4) since LCVCO 302 is turned off and LCVCO 304 is turned on by the control signal SEL. Even though two LCVCOs 302 and 304 are connected to the multiplexer 308 in FIG. 3, a greater number of LCVCOs can be connected to the multiplexer 308 with the control signal connected to each LCVCO arranged to turn on one LCVCO and turn off the rest of LCVCOs. For example, three, four, five, etc. LCVCOs can be connected to the multiplexer 308. An exemplary multiplexer circuit 308 is described below.

Figure 4:
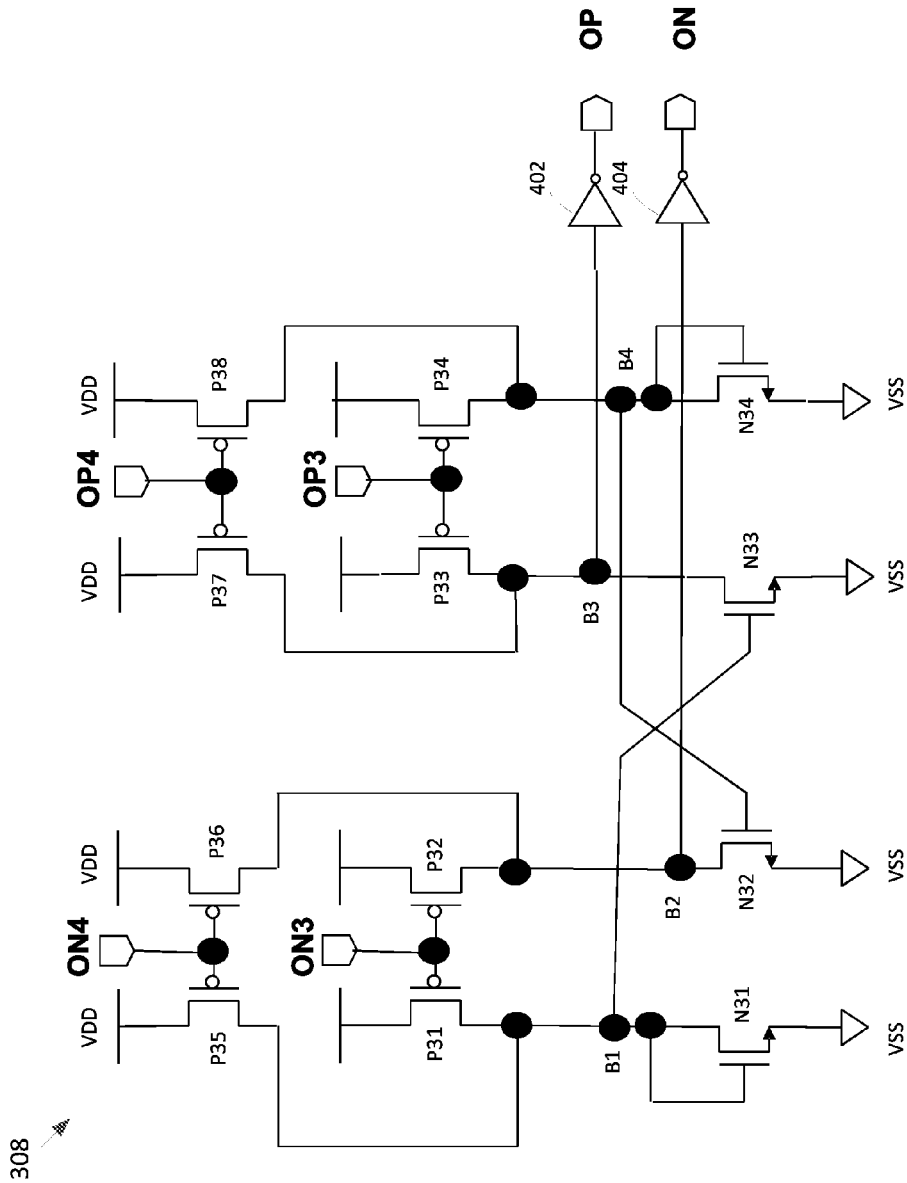
FIG. 4 is an exemplary multiplexer for the multiple frequency LCVCO in FIG. 3 in accordance with some embodiments.

FIG. 4 is an exemplary multiplexer for the multiple frequency LCVCO in FIG. 3 in accordance with some embodiments. The multiplexer 308 is a converter connected to the LCVCO outputs ON3, OP3, ON4, OP4 and configured to provide a differential output signal (OP and ON) with a full voltage swing in some embodiments. In the description below, the multiplexer 308 is also referred to as the converter 308. Due to parasitic resistance in the LCVCOs 302 and 304, the outputs OP3, ON3, OP4, ON4 may not have a full voltage swing. For example, when the power supply voltage VDD=0.8 V, the voltage swing of OP3, ON3, OP4, ON4 may be from 0.2 V to 0.6 V, instead of from 0 V to 0.8 V. The converter 308 receives the LCVCO differential outputs OP3, ON3, OP4, ON4 with a less than full voltage swing, such as from 0.2 V to 0.6 V, and provides a differential output OP and ON with a full voltage swing from 0 V to 0.8 V in some embodiments.

The converter 308 includes four NMOS transistors N31, N32, N33, and N34 connected to the ground VSS. The NMOS transistors N31 and N34 are diode-connected and gates of NMOS transistors N32 and N33 are connected to the drains of NMOS transistors N34 and N31, respectively.

The differential output from LCVCO 302 is connected to the converter 308 through PMOS transistors P31, P32, P33, and P34. The PMOS transistors P31, P32, P33, and P34 are serially connected to the NMOS transistors N31, N32, N33, and N34, respectively. The gates of the PMOS transistors P31 and P32 are connected to one signal ON3 of the differential output from LCVCO 302. The gates of the PMOS transistors P33 and P34 are connected to the other signal OP3 of the differential output from LCVCO 302.

The differential output from LCVCO 304 is connected to the gates of PMOS transistors P35, P36, P37, and P38 of the converter 308. The PMOS transistors P35, P36, P37, and P38 are also serially connected to the NMOS transistors N31, N32, N33, and N34, respectively. The gates of the PMOS transistors P35 and P36 are connected to one signal ON4 of the differential output from LCVCO 304. The gates of the PMOS transistors P37 and P38 are connected to the other signal OP4 of the differential output from LCVCO 304.

The drains of the NMOS transistor N32, PMOS transistor P32 and P36 are connected to an inverter 404 that provides one signal ON of the differential output from the converter 308. The drains of the NMOS transistor N33, PMOS transistor P33 and P37 are connected to an inverter 402 that provides the other signal OP of the differential output from the converter 308.

As an example, it is assumed that the LCVCO 302 is selected to be turned on and the differential output from LCVCO 302 has a first signal OP3 having logic 0 (logic low), and a second signal ON3 having logic 1 (logic high). Since OP3 has logic 0, PMOS transistors P33 and P34 are turned on. Thus, the voltage at a node B3 is pulled up to logic 1. Node B3 is connected to the inverter 402 that provides logic 0 (the same as OP3) as the other signal OP of the differential output from the converter 308. Also, node B4 connected to the gate of the NMOS transistor N32 is pulled up to logic 1. Thus, the NMOS transistor N32 is turned on. Since ON3 has logic 1, PMOS transistors P31 and P32 are turned off. Since NMOS transistor N32 is turned on and PMOS transistor P32 is turned off, node B2 is pulled down to logic 0. Node B2 is connected to the inverter 404 that provides logic 1 as one signal ON (the same as ON3) of the differential output from the converter 308. Therefore, the differential output signal of the converter 308 with OP and ON follows the differential output signal of the LCVCO 302 with OP3 and ON3.

Also, the differential output signal of the converter 308 with OP and ON have a full swing voltage after inverters 402 and 404, i.e., from the power supply voltage VDD to ground. Since LCVCO 304 is not selected in this example, the LCVCO 304 is turned off, and the differential output of the LCVCO 304 with ON4 and OP4 has no signal and does not affect the output OP and ON of the converter 308. If the LCVCO 304 is selected instead of LCVCO 302, the differential output of the converter 308 with OP and ON follows the differential output signal of the LCVCO 304 with OP4 and ON4.

Even though outputs from two LCVCOs 302 and 304 are connected to the multiplexer 308 in FIG. 4, a greater number of LCVCOs can be connected to the multiplexer 308. For example, outputs from three, four, five, etc. LCVCOs can be connected to the multiplexer 308 in a similar way using additional PMOS transistors connected to nodes B1, B2, B3, and B4.

By using the multiple LCVCOs 302 and 304 having NMOS transistor switches N25 and N26, the operation power is saved because one LCVCO is selected to be turned on and the other LCVCO is turned off. The converter 308 as a multiplexer provides a full voltage swing output. In some embodiments, the multiple frequency LCVCO 300 operates with a high speed operating frequency, e.g., LCVCO 302 in 14 GHz and LCVCO 304 in 20 GHz. The multiplexer 308 has one layer of PMOS transistors P31, P32, P33, P34, P35, P36, P37, and P38 from the power supply voltage VDD that are serially connected to another layer of NMOS transistors N31, N32, N33, and N34 that are connected to the ground. Compared to other multiple frequency LCVCO circuits having a multiplexer with three or more transistor layers connected from the power supply voltage VDD to the ground, there is no voltage headroom issue related to threshold voltages with the multiplexer 308 in FIG. 4.

Figure 5:
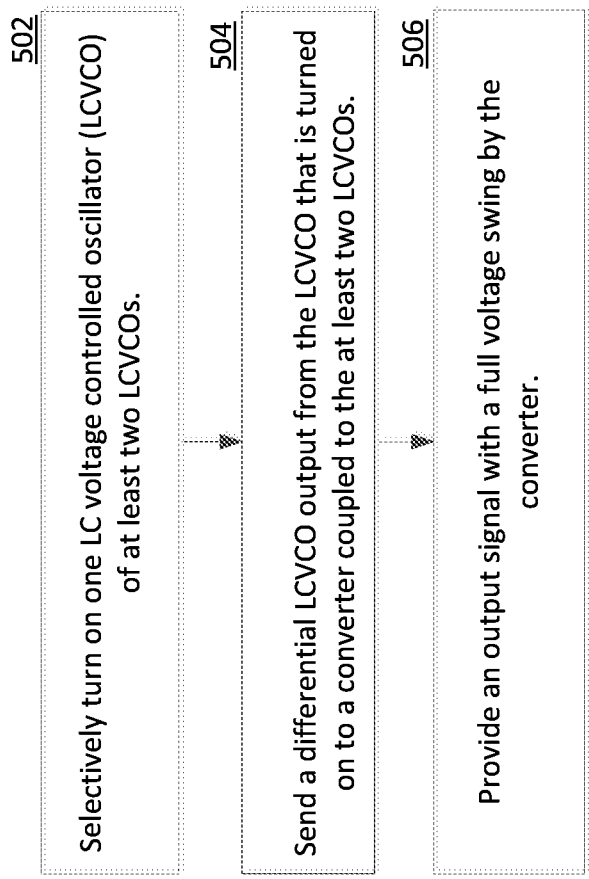
FIG. 5 is an exemplary flowchart of operation method for the multiple frequency LCVCO in FIGS. 1 and 3 in accordance with some embodiments.

FIG. 5 is an exemplary flowchart of operation method for the multiple frequency LCVCO 100 and 300 in FIGS. 1 and 3 in accordance with some embodiments. At step 502, one LC voltage controlled oscillator (LCVCO) of at least two LCVCOs is selectively turned on. In some embodiments, one LCVCO is selected based on the operating frequency. Each LCVCO such as 102, 104, 302, or 304 has a switch such as PMOS transistor P1, P4, NMOS transistor N25, or N26 to turn on or off the LCVCO in some embodiments. A control signal connected to the switch of each LCVCO turns on one LCVCO and turns off the other LCVCOs in some embodiments.

At step 504, a differential LCVCO output is sent from the LCVCO that is turned on to a converter such as 108 or 308 coupled to the at least two LCVCOs. The differential LCVCO output has two signals such as OP1 and ON1, OP2 and ON2, OP3 and ON3, or OP4 and ON4 in some embodiments. In some embodiments, the LCVCOs have different operating frequencies.

At step 506, an output signal with a full voltage swing is provided by the converter such as 108 or 308. The output signal is a differential signal that has two signals such as OP and ON in some embodiments. The output signal has a voltage swing from the power supply voltage VDD to the ground in some embodiments.

According to some embodiments, a circuit includes at least two LC voltage controlled oscillators (LCVCOs). Each LCVCO includes a switch configured to selectively turn on or off the LCVCO. One selected LCVCO of the at least two LCVCOs is configured to provide a differential LCVCO output. A converter coupled to the at least two LCVCOs is configured to receive the differential LCVCO output and to provide an output signal with a full voltage swing.

According to some embodiments, a method includes selectively turning on one LC voltage controlled oscillator (LCVCO) of at least two LCVCOs. A differential LCVCO output is sent from the LCVCO that is turned on to a converter coupled to the at least two LCVCOs. An output signal is provided with a full voltage swing by the converter.

According to some embodiments, a circuit includes at least two LC voltage controlled oscillators (LCVCOs). Each LCVCO has an operating frequency given by $$fo = \frac{1}{2\pi\sqrt{LC}},$$

where fo is the operating frequency, L is an inductance value of an inductor in the LCVCO, and C is a capacitance value of a capacitor in the LCVCO. A control signal is connected to a switch of each LCVCO that is configured to turn on or off each LCVCO. One selected LCVCO of the at least two LCVCOs is configured to provide a differential LCVCO output. A converter is coupled to the at least two LCVCOs and configured to receive the differential LCVCO output and to provide an output signal with a full voltage swing.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit, comprising:
   at least two LC voltage controlled oscillators (LCVCOs), wherein each LCVCO includes a switch configured to selectively turn on or off the each LCVCO, and at least one selected LCVCO of the at least two LCVCOs is configured to provide a differential LCVCO output having a voltage swing less than a full voltage swing; and
   a converter coupled to the at least two LCVCOs and configured to receive the differential LCVCO output, wherein the converter comprises a multiplexer coupled to a respective LCVCO output of each of the at least two LCVCOs, wherein the multiplexer is configured to provide an output signal with the full voltage swing, and wherein the multiplexer comprises a pair of PMOS transistors having diode connected gates.

2. The circuit of claim 1, wherein the switch of each LCVCO is a PMOS transistor connected to a power supply voltage.

3. The circuit of claim 1, wherein the switch of each LCVCO is an NMOS transistor connected to a ground.

4. The circuit of claim 1, wherein a control signal is connected to the switch of each LCVCO to turn on one LCVCO of the at least two LCVCOs.

5. The circuit of claim 1, wherein each LCVCO includes a first PMOS transistor serially connected to a first NMOS transistor, and a second PMOS transistor serially connected to a second NMOS transistor, wherein gates of the first PMOS transistor and the first NMOS transistor are connected to drains of the second PMOS transistor and the second NMOS transistor, and gates of the second PMOS transistor and the second NMOS transistor are connected to drains of the first PMOS transistor and the first NMOS transistor.

6. The circuit of claim 5, wherein each LCVCO further includes an inductor connected to drains of the first PMOS transistor, the first NMOS transistor, the second PMOS transistor, and the second NMOS transistor.

7. The circuit of claim 5, wherein each LCVCO further includes a capacitor connected to drains of the first PMOS transistor, the first NMOS transistor, the second PMOS transistor, and the second NMOS transistor.

8. The circuit of claim 1, wherein a first operating frequency of a first LCVCO of the at least two LCVCOs is different from a second operating frequency of a second LCVCO of the at least two LCVCOs.

9. The circuit of claim 1, wherein an operating frequency of each LCVCO is given by $$fo = \frac{1}{2\pi\sqrt{LC}},$$

where $f_o$ is the operating frequency, L is an inductance value of an inductor in the LCVCO, and C is a capacitance value of a capacitor in the LCVCO.

10. The circuit of claim 1, wherein the converter includes a first PMOS transistor serially connected to a first NMOS transistor, a second PMOS transistor serially connected to a second NMOS transistor, a third PMOS transistor serially connected to a third NMOS transistor, and a fourth PMOS transistor serially connected to a fourth NMOS transistor, wherein the first PMOS transistor and the fourth PMOS transistor are the pair of PMOS transistors, gates of the first PMOS transistor and the third PMOS transistor are connected together, gates of the second PMOS transistor and the fourth PMOS transistor are connected together, gates of the first NMOS transistor and the second NMOS transistor are connected to a first output of a first differential LCVCO output, gates of the third NMOS transistor and the fourth NMOS transistor are connected to a second output of the first differential LCVCO output.

11. The circuit of claim 10, wherein the converter further includes a fifth NMOS transistor, a sixth NMOS transistor, a seventh NMOS transistor, and an eighth NMOS transistor, wherein gates of the fifth NMOS transistor and the sixth NMOS transistor are connected to a first output of a second differential LCVCO output, and gates of the seventh NMOS transistor and the eighth NMOS transistor are connected to a second output of the second differential LCVCO output.

12. A method, comprising:
   selectively turning on one LC voltage controlled oscillator (LCVCO) of at least two LCVCOs,
   sending a differential LCVCO output from the LCVCO that is turned on to a converter coupled to the at least two LCVCOs, wherein the differential LCVCO output has a voltage swing less than a full voltage swing, wherein the converter includes a multiplexer directly connected to a respective output of each of the at least two LCVCOs; and
   providing an output signal with a full voltage swing by the multiplexer, wherein the multiplexer comprises a first PMOS transistor and a second PMOS transistor, and wherein gates of the first PMOS transistor and the second PMOS transistor are diode connected.

13. The method of claim 12, wherein selectively turning on one LCVCO comprises turning on a switch connected to a selected LCVCO of the at least two LCVCOs.

14. The method of claim 13, wherein the switch is a PMOS transistor connected to a power supply voltage.

15. The method of claim 13, wherein the switch is an NMOS transistor connected to a ground.

16. The method of claim 12, wherein one LCVCO is selectively turned on based on an operating frequency of the LCVCO.

17. The method of claim 16, wherein the operating frequency is given by $$fo = \frac{1}{2\pi\sqrt{LC}},$$

where fo is the operating frequency, L is an inductance value of an inductor in the LCVCO, and C is a capacitance value of a capacitor in the LCVCO.

18. The method of claim 12, wherein a first operating frequency of a first LCVCO of the at least two LCVCOs is different from a second operating frequency of a second LCVCO of the at least two LCVCOs.

19. A circuit, comprising:
at least two LC voltage controlled oscillators (LCVCOs), wherein each LCVCO has an operating frequency given by $$fo = \frac{1}{2\pi\sqrt{LC}},$$

where fo is the operating frequency, L is an inductance value of an inductor in the LCVCO, and C is a capacitance value of a capacitor in the LCVCO, a control signal is connected to a respective switch of each respective LCVCO, the respective switch being configured to turn on or off each respective LCVCO, wherein the turned on LCVCO of the at least two LCVCOs is configured to provide a differential LCVCO output having a voltage swing less than a full voltage swing; and
a converter coupled to the at least two LCVCOs and configured to receive the differential LCVCO output and to provide an output signal with the full voltage swing, wherein the converter comprises a multiplexer providing the full voltage swing, and wherein the multiplexer comprises a first PMOS transistor, a second PMOS transistor, a third PMOS transistor, and a fourth PMOS transistor, wherein the first PMOS transistor and the fourth PMOS transistor are diode-connected, wherein gates of the first PMOS transistor and the third PMOS transistor are connected together, and wherein gates of the second PMOS transistor and the fourth PMOS transistor are connected together.

20. The circuit of claim 19, wherein each LCVCO includes a first PMOS transistor serially connected to a first NMOS transistor, and a second PMOS transistor serially connected to a second NMOS transistor, an inductor connected to drains of the first PMOS transistor, the first NMOS transistor, the second PMOS transistor, and the second NMOS transistor, a capacitor connected to drains of the first PMOS transistor, the first NMOS transistor, the second PMOS transistor, and the second NMOS transistor, wherein gates of the first PMOS transistor and the first NMOS transistor are connected to drains of the second PMOS transistor and the second NMOS transistor, and gates of the second PMOS transistor and the second NMOS transistor are connected to drains of the first PMOS transistor and the first NMOS transistor.

* * * * *